(12) United States Patent
Chu et al.

(10) Patent No.: US 7,852,632 B2
(45) Date of Patent: Dec. 14, 2010

(54) HEAT DISSIPATION MODULE AND DETACHABLE EXPANSION CARD USING THE SAME

(75) Inventors: Hung-Chun Chu, Taipei (TW); Hsi-Feng Lin, Taipei (TW); Zhi-Houng Pan, Taipei (TW)

(73) Assignee: ASUSTeK Computer Inc., Taipei (TW)

( * ) Notice: Subject to any disclaimer, the term of this patent is extended or adjusted under 35 U.S.C. 154(b) by 106 days.

(21) Appl. No.: 12/188,174

(22) Filed: Aug. 7, 2008

(65) Prior Publication Data

US 2009/0040722 A1    Feb. 12, 2009

(30) Foreign Application Priority Data

Aug. 10, 2007    (TW) ............................. 96129604 A

(51) Int. Cl.
*H05K 7/20* (2006.01)
(52) U.S. Cl. .................. 361/703; 361/697; 361/700; 361/719; 165/104.33; 257/E23.099
(58) Field of Classification Search ............... 361/695, 361/697, 700, 703, 704, 719, 720, 710, 715, 361/688, 698
See application file for complete search history.

(56) References Cited

U.S. PATENT DOCUMENTS

| | | | |
|---|---|---|---|
| 5,718,282 A * | 2/1998 | Bhatia et al. ................. 165/86 |
| 5,854,738 A | 12/1998 | Bowler | |
| 6,226,178 B1 * | 5/2001 | Broder et al. ........... 361/679.52 |
| 6,667,882 B2 | 12/2003 | Pauser | |
| 7,100,681 B1 * | 9/2006 | Wu et al. ................ 165/104.33 |
| 7,382,616 B2 * | 6/2008 | Stefanoski ................... 361/698 |
| 2007/0097644 A1 * | 5/2007 | Lu et al. ...................... 361/700 |
| 2007/0268670 A1 * | 11/2007 | Chu et al. .................... 361/702 |
| 2009/0059538 A1 * | 3/2009 | Peng et al. ................... 361/719 |

\* cited by examiner

*Primary Examiner*—Jayprakash N Gandhi
*Assistant Examiner*—Courtney Smith
(74) *Attorney, Agent, or Firm*—Jianq Chyun IP Office

(57) ABSTRACT

A heat-dissipation module dissipating heat for a heat-generating element on circuit board and including a heat-transferring base, a base, a first heat-dissipation unit, a heat pipe and a second heat-dissipation unit is provided. One surface of the heat-transferring base contacts the heat-generating element. The base is connected to the other surface of the heat-transferring base and has a heat-transferring block. The first heat-dissipation unit has a first fin assembly provided on the base. The first heat pipe is embedded in the heat-transferring base, one end thereof passes through the first heat-dissipation unit, and the other end thereof passes through the heat-transferring block. The second heat-dissipation unit has a second fin assembly and a second heat pipe passing through the second fin assembly and actively connected to the heat-transferring block along a route. The second heat-dissipation unit is suitable to move relative to the first heat-dissipation unit along the route.

18 Claims, 5 Drawing Sheets

HEAT DISSIPATION MODULE AND DETACHABLE EXPANSION CARD USING THE SAME

CROSS-REFERENCE TO RELATED APPLICATION

This application claims the priority benefit of Taiwan application serial no. 96129604, filed on Aug. 10, 2007. The entirety of the above-mentioned patent application is hereby incorporated by reference herein and made a part of specification.

BACKGROUND OF THE INVENTION

1. Field of the Invention

The invention relates to a detachable expansion card and, more particularly, to a detachable expansion card with a heat dissipation module.

2. Description of the Related Art

With the development of the science and technology, the computer becomes essential in lives and works of the human being. The computer allows various information to be stored more conveniently, the transmission to be more fast and the files to be processed more easily, and it also brings convenience to different aspects such as eating, clothing, living, traffic, bearing and entertainment of the people' lives.

The computer host usually includes various expansion cards to improve the performance. The expansion card is, for example, a sound card, a network card, a display card or other detachable expansion card. With the improvement of the operation performance of the chip in the expansion card, some expansion card is equipped with an independent fin assembly to dissipate heat for the chip of the expansion card. However, the cooling air in the computer system is affected by the expansion card and the plate body thereof, and then it does not flow to the fin assembly easily. Thus, the heat dissipation efficiency is not preferred.

To solve the above problem, the fin assembly is disposed outside the expansion card in the conventional technology, and the cooling air flows to the fin assembly successfully to dissipate heat for the fin assembly. However, if the fin assembly is disposed outside the expansion card, the heat dissipation structure occupies a large room, and the fin assembly is easily damaged by external force in the transporting process.

BRIEF SUMMARY OF THE INVENTION

The invention provides a heat dissipation module with preferred heat dissipation efficiency.

The invention provides a detachable expansion card with the heat dissipation module.

The invention provides a heat dissipation module which is suitable to dissipation heat for a heat generating element on a circuit board. The heat dissipation module includes a heat transferring base, a base, a first heat dissipation unit, a first heat pipe and a second heat dissipation unit. One surface of the heat transferring base contacts the heat generating element. The base is connected to the other surface of the heat transferring base, and it has a heat transferring block. The first heat dissipation unit has a first fin assembly provided at the base. The first heat pipe is embedded in the heat transferring base. One end of the first heat pipe passes through the first heat dissipation unit, and the other end passes through the heat transferring block. The second heat dissipation unit has a second fin assembly and a second heat pipe. The second heat pipe passes through the second fin assembly and is actively connected to the heat transferring block along a route. The second heat dissipation unit is suitable to move relative to the first heat dissipation unit along the route.

In one embodiment, the first heat pipe has a first pipe body embedded at the heat transferring base, a second pipe body extending from one end of the first pipe body and passing through the first heat dissipation unit and a third pipe body extending from the other end of the first pipe body and passing through the heat transferring block.

In one embodiment of the invention, the first heat dissipation unit further includes a first cover covering the first fin assembly, and the first heat pipe passes through the first cover and the first fin assembly.

In one embodiment of the invention, at least a guiding rail is disposed at the base, and at least a guiding element is disposed at the second heat dissipation unit. The second heat dissipation unit is glidingly disposed at the guiding rail via the guiding element to move along the route.

In one embodiment of the invention, the second heat dissipation unit further includes a second cover covering the second fin assembly. The second heat pipe passes through the second cover and the second fin assembly.

In one embodiment of the invention, the guiding element is a connecting post disposed at one surface of the second cover, and the surface faces the base.

In one embodiment of the invention, the heat transferring base further includes a plurality of supporting posts connected to the base.

In one embodiment of the invention, the heat transferring block has two through holes. The first heat pipe passes through one of the through holes, and the second heat pipe actively passes through the other one along the route.

In one embodiment of the invention, the heat dissipation further includes two pieces of heat dissipation cream provided in the through holes. The first heat pipe contacts the heat transferring block via one of the two pieces of the heat dissipation cream, and the second heat pipe contacts the heat transferring block via the other one of the two pieces of the heat dissipation cream.

The invention provides a detachable expansion card including a circuit board with a heat generating element and a heat dissipation module suitable to dissipate heat for the heat generating element. The heat dissipation module includes a heat transferring base, a base, a first heat dissipation unit, a first heat pipe and a second heat dissipation unit. One surface of the heat transferring base contacts the heat generating element. The base is connected to the other surface of the heat transferring base, and it has a heat transferring block. The first heat dissipation unit has a first fin assembly provided at the base. The first heat pipe is embedded in the heat transferring base. One end of the first heat pipe passes through the first heat dissipation unit, and the other end passes through the heat transferring block. The second heat dissipation unit has a second fin assembly and a second heat pipe. The second heat pipe passes through the second fin assembly and is actively connected to the heat transferring block along a route. The second heat dissipation unit is suitable to move relative to the first heat dissipation unit along the route.

In one embodiment, the first heat pipe has a first pipe body embedded at the heat transferring base, a second pipe body extending from one end of the first pipe body and passing through the first heat dissipation unit and a third pipe body extending from the other end of the first pipe body and passing through the heat transferring block.

In one embodiment of the invention, the first heat dissipation unit further includes a first cover covering the first fin assembly, and the first heat pipe passes through the first cover and the first fin assembly.

In one embodiment of the invention, at least a guiding rail is disposed at the base, and at least a guiding element is disposed at the second heat dissipation unit. The second heat dissipation unit is glidingly disposed at the guiding rail via the guiding element to move along the route.

In one embodiment of the invention, the second heat dissipation unit further includes a second cover covering the second fin assembly. The second heat pipe passes through the second cover and the second fin assembly.

In one embodiment of the invention, the guiding element is a connecting post disposed at one surface of the second cover, and the surface faces the base.

In one embodiment of the invention, the heat transferring base further includes a plurality of supporting posts connected to the base.

In one embodiment of the invention, the heat transferring block has two through holes. The first heat pipe passes through one of the through holes, and the second heat pipe actively passes through the other one along the route.

In one embodiment of the invention, the heat dissipation module further includes two pieces of heat dissipation cream provided in the through holes. The first heat pipe contacts the heat transferring block via one of the two pieces of the heat dissipation cream, and the second heat pipe contacts the heat transferring block via the other one of the two pieces of the heat dissipation cream.

In the heat dissipation module in the invention, the second heat dissipation unit is capable of sliding to the outer side of the circuit board relative to the first heat dissipation unit to have preferred heat dissipation efficiency.

These and other features, aspects, and advantages of the present invention will become better understood with regard to the following description, appended claims, and accompanying drawings.

DETAILED DESCRIPTION OF THE EMBODIMENTS

Figure 1A:
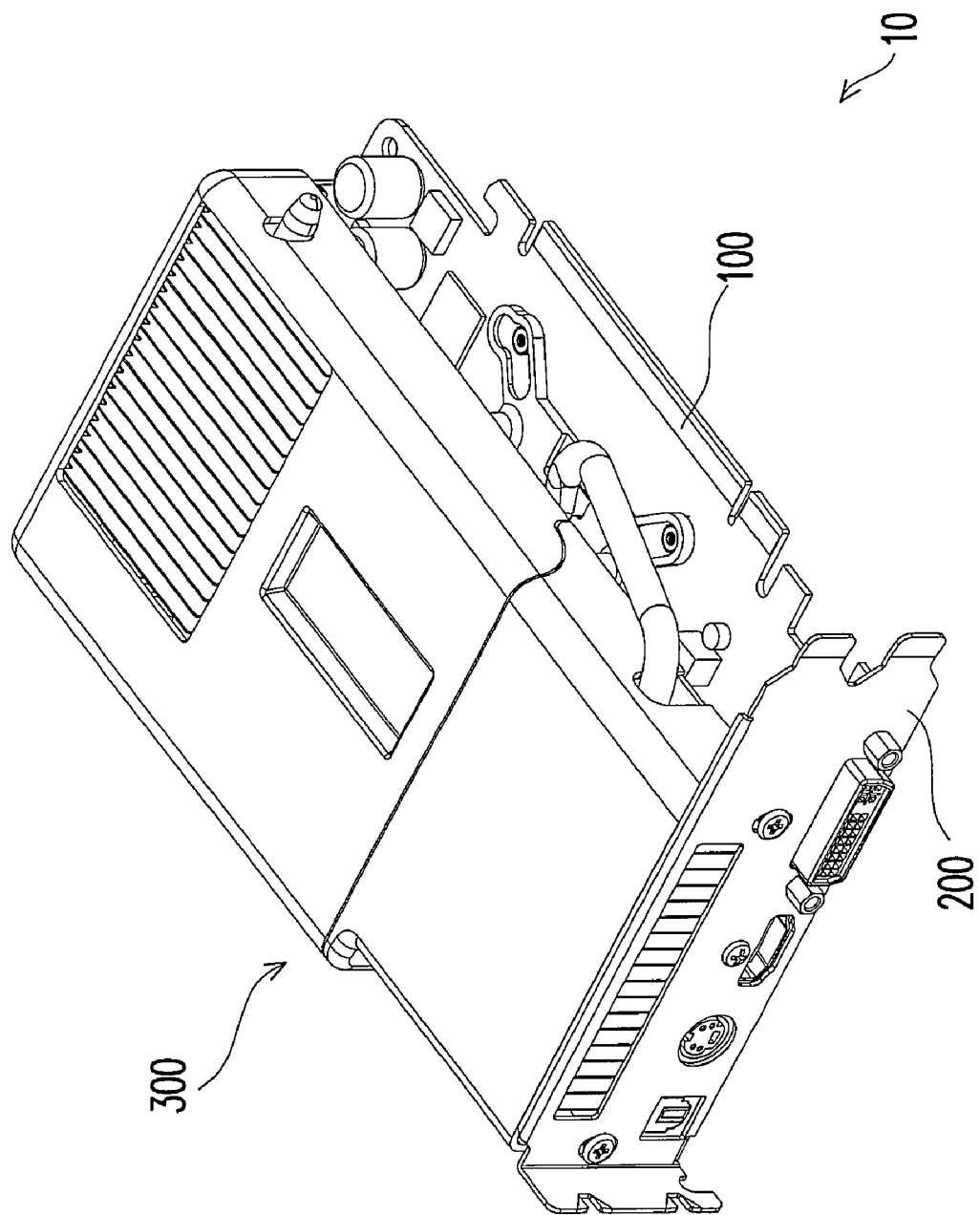
FIG. 1A is a three dimensional schematic diagram showing a detachable expansion card according to one embodiment of the invention.
Figure 1B:
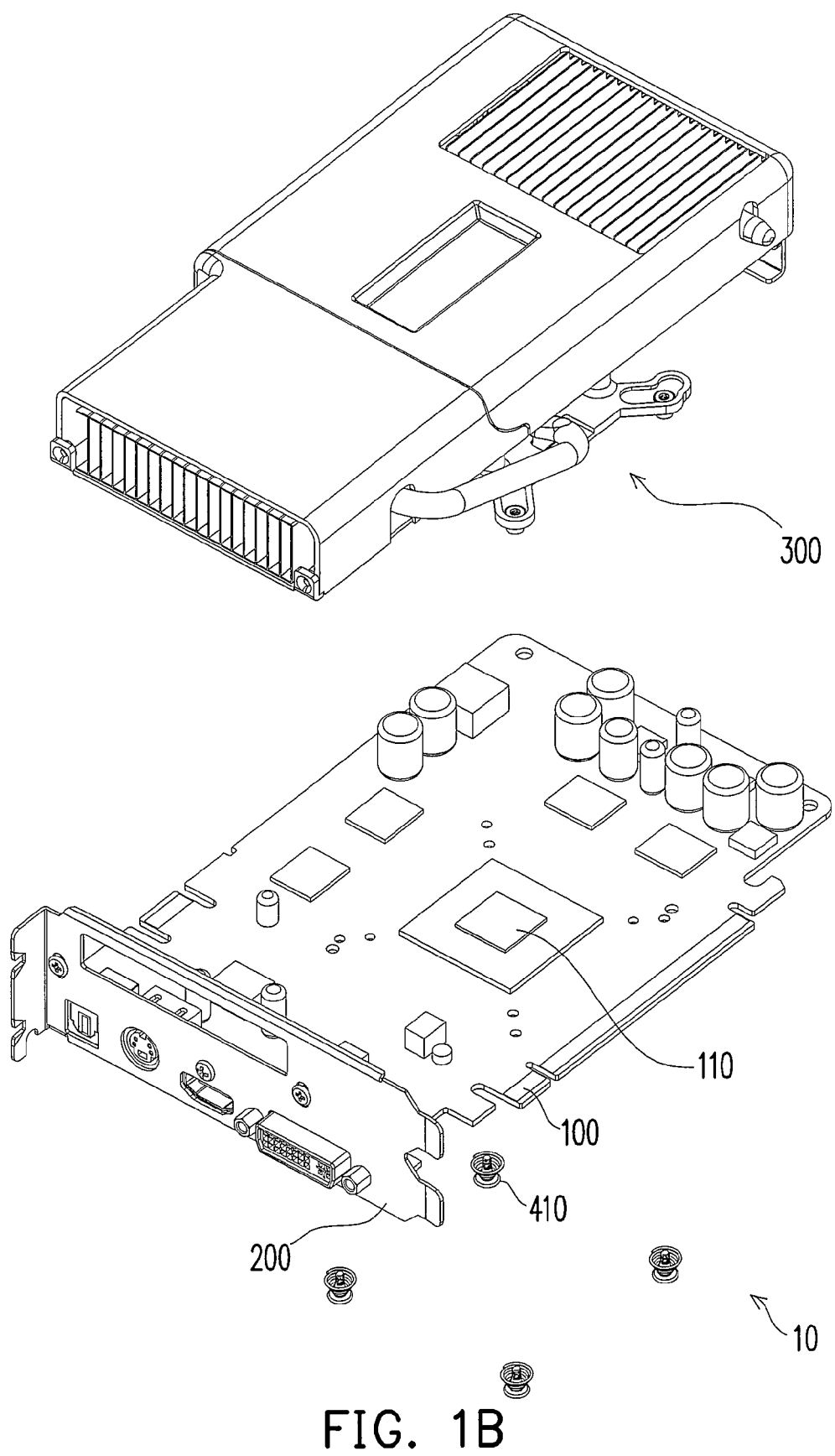
FIG. 1B is an exploded diagram showing part of a detachable expansion card according to one embodiment of the invention.

FIG. 1A is a three dimensional schematic diagram showing a detachable expansion card according to one embodiment of the invention. FIG. 1B is an exploded diagram showing part of a detachable expansion card according to one embodiment of the invention. As shown in FIG. 1A and FIG. 1B, a detachable expansion card 10 is, for example, a graphic card, and it includes a circuit board 100, a connecting plate 200 and a heat dissipation module 300. The circuit board 100 has a heat generating element 110 which is, for example, a graphic processing unit (GPU), and the connecting plate 200 is disposed at one side of the circuit board 100. The heat dissipation module 300 is assembled on the circuit board 100 to dissipate heat for the heat generating element 110. In the embodiment, the heat dissipation module 300 is, for example, screwed on the circuit board 100 via a plurality of screws 410. The heat dissipation module 300 is described in detail hereinbelow.

Figure 2:
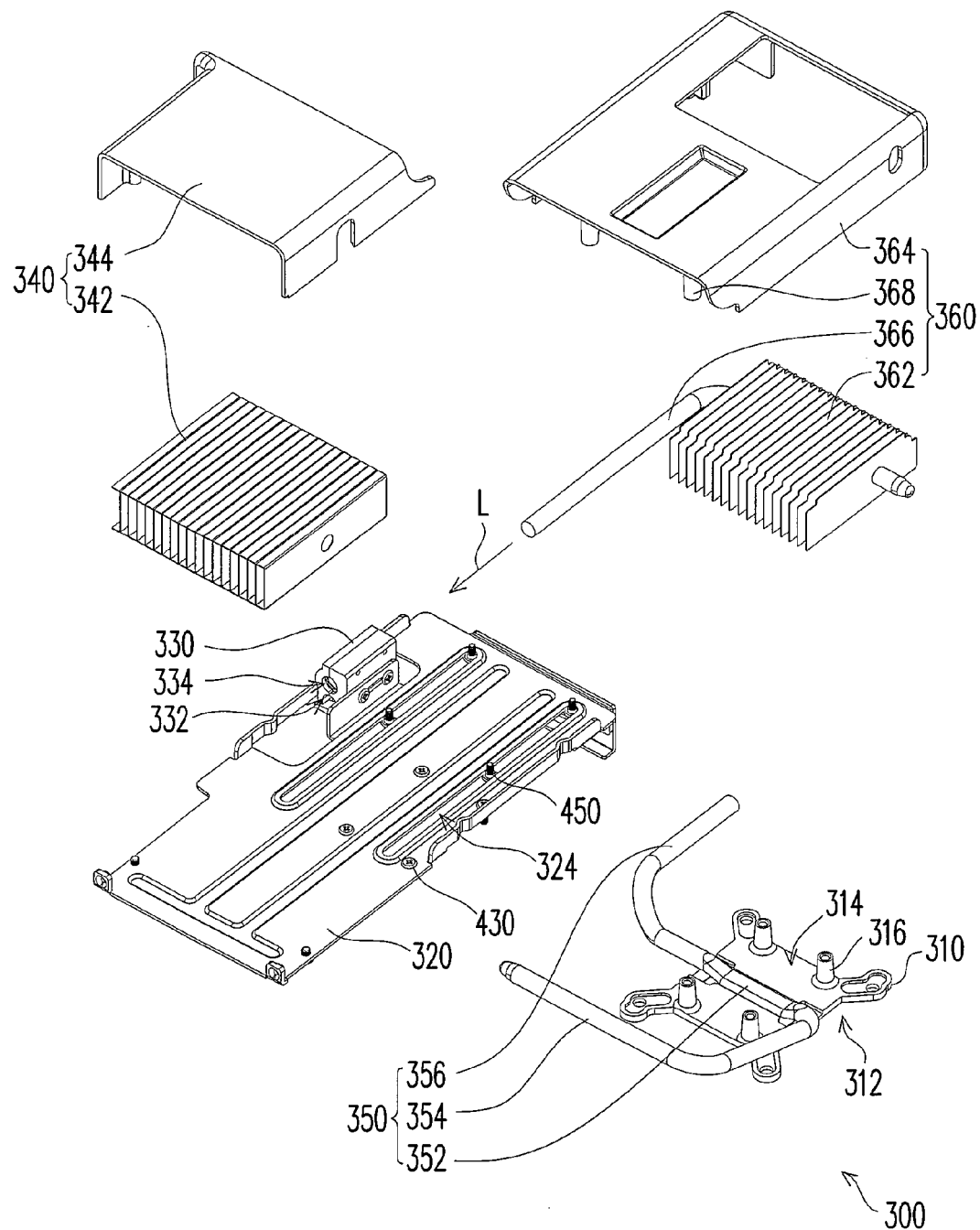
FIG. 2 is an exploded diagram showing the heat dissipation module shown in FIG. 1B.
Figure 3:
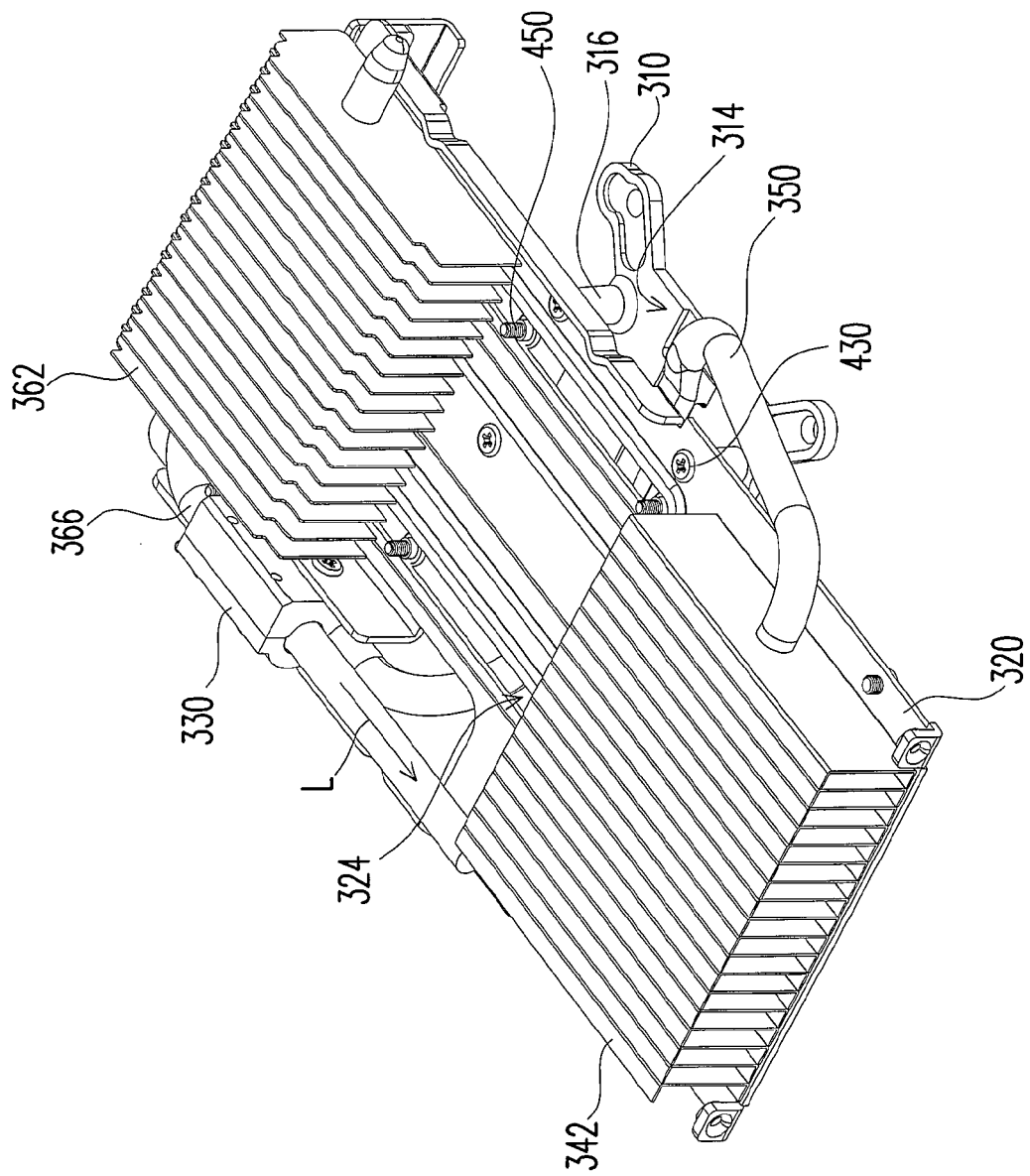
FIG. 3 is a schematic diagram showing the heat dissipation module whose first cover and second cover are removed in FIG. 1B.

FIG. 2 is an exploded diagram showing the heat dissipation module in FIG. 1B, and FIG. 3 is a schematic diagram showing the heat dissipation module whose first cover and second cover are removed in FIG. 1B. As shown in FIG. 2 and FIG. 3, the heat dissipation module 300 of the embodiment mainly includes a heat transferring base 310, a base 320, a heat transferring block 330, a first heat dissipation unit 340, a first heat pipe 350 and a second heat dissipation unit 360. The heat transferring base 310 has a first surface 312 and a second surface 314 corresponding to the first surface 312. The first surface 312 is suitable to contact the heat generating element 110 (shown in FIG. 1B) on the circuit board 100. In addition, a plurality of supporting posts 316 are disposed on the second surface 314. In addition, the base 320 is, for example, assembled to the heat transferring base 310 via the connection relationship between a plurality of screws 430 and the supporting posts 316.

In addition, the first heat dissipation unit 340 of the embodiment is disposed at the base 320. The first heat dissipation unit 330 is, for example, composed of a first fin assembly 342 provided on the base 320 and a first cover 344 covering the first fin assembly 342. In addition, the second heat dissipation unit 360 is actively provided on the base 320. In detail, the second heat dissipation unit 360 has a second fin assembly 362, a second cover 364, a second heat pipe 366 and at least a guiding element 368 (two guiding elements are shown in the drawings in the embodiment). The second cover 364 covers the second fin assembly 362, and the second heat pipe 366 passes through the second fin assembly 362 and the second cover 364. The second heat pipe 366 is actively connected to the heat transferring block 330 disposed on the base 320 along a route L. In the embodiment, for example, the second heat pipe 366 actively passes through a through hole 334 of the heat transferring block 330 along the route L.

In the embodiment, heat dissipation cream may be further disposed in the through hole 334, and the second heat pipe 366 may contact the heat transferring block 330 via the heat dissipation cream to improve the heat transferring efficiency between the heat transferring block and the second heat pipe 366. In addition, the guiding element 368 is disposed at one surface of the second cover 364, and the surface faces the base 320. In the embodiment, a plurality of screws 450 pass through at least a guiding rail 324 (two guiding rails 324 in FIG. 2) of the base 320 and are screwed to the guiding elements 368 such as the connecting posts. In this way, the whole second heat dissipation unit 360 is capable of moving relative to the first heat dissipation unit via the connection relationship between the guiding rails 324 and the guiding elements 368 glidingly disposed at the guiding rails 324.

In the embodiment, the first heat pipe 350 is embedded at the heat transferring base 310. One end of the first heat pipe 350 passes through the first heat dissipation unit 340, and the other end passes through the heat transferring block 330 on the base 320. In detail, the first heat pipe 350 of the embodiment is, for example, composed of a first pipe body 352, a second pipe body 354 and a third pipe body 356. The first pipe body 352 is embedded at the heat transferring base 310. The second pipe body 354 extends from one end of the first pipe body 352 and passes through the first fin assembly 342, and the third pipe body 356 extends from the other end of the first pipe body 352 and passes through another through hole 332 of the heat transferring block 330. In this way, the heat generated by the heat generating element 110 (shown in FIG. 1B) is transferred to the first fin assembly 342 via the second pipe body 354 to be dissipated. The heat generated by the heat generating element 110 (shown in FIG. 1B) also is transferred to the second heat pipe 366 connected to the heat transferring block 330 via the third pipe body 356 and is transferred to the second fin assembly 362 via the second heat pipe 366 to be dissipated.

Similarly, another heat dissipation cream may be disposed in the through hole 332, and the first heat pipe 350 may contact the heat transferring block 330 via the heat dissipation cream to improve the heat conducting efficiency between the heat transferring block 330 and the first heat pipe 350.

Figure 4:
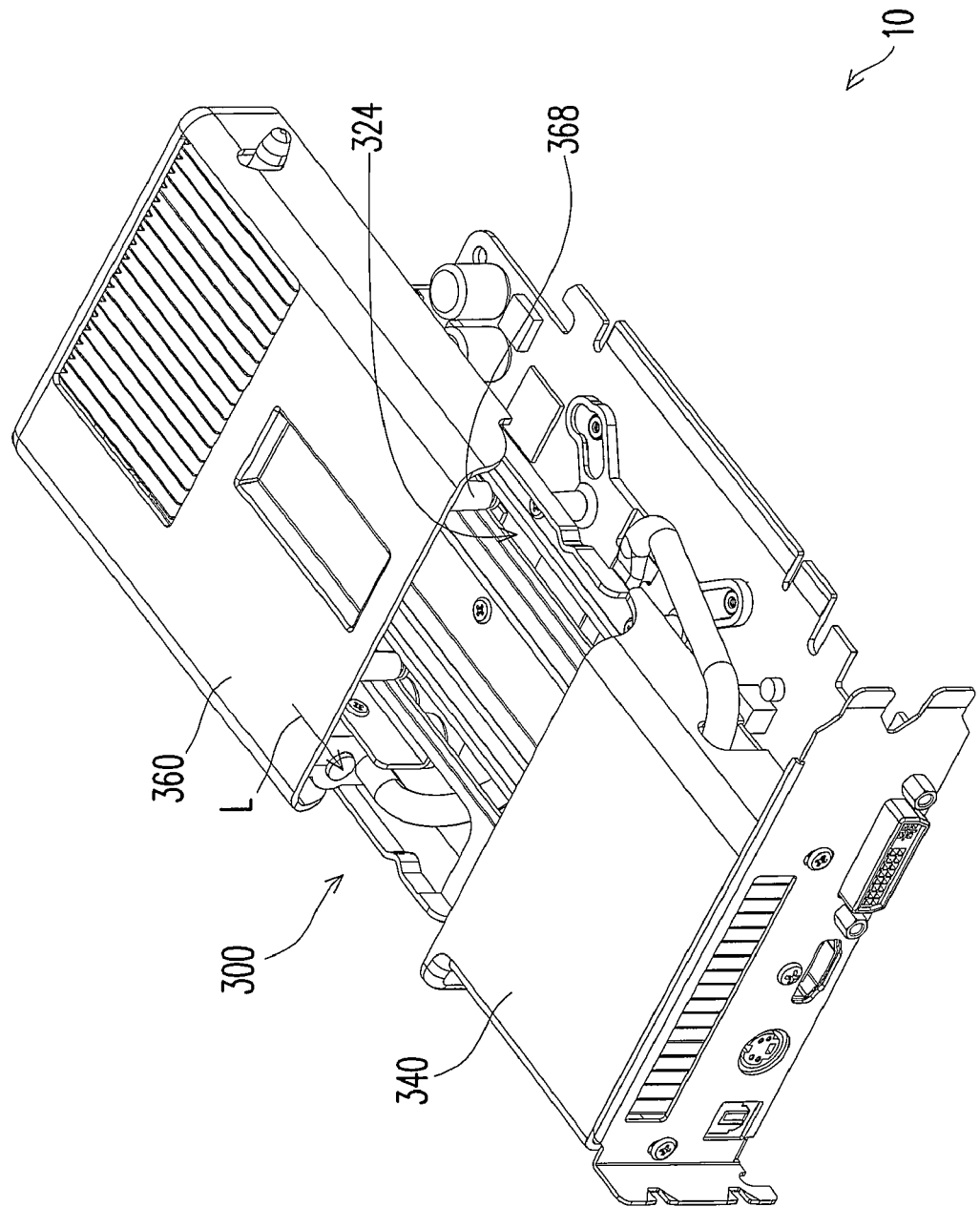
FIG. 4 is a schematic diagram showing the second heat dissipation unit in FIG. 1A moving relative to the first heat dissipation unit along a route.

FIG. 4 is a schematic diagram showing the second heat dissipation unit in FIG. 1A moving relative to the first heat dissipation unit along a route. As shown in FIG. 4, the second heat dissipation unit 360 is capable of moving relative to the first heat dissipation unit 340 along the route L via the cooperation between the guiding rails 324 and the guiding elements 368. Therefore, when the detachable expansion card 10 is assembled to an electronic device (not shown), the second heat dissipation unit 360 may slide to a position having a preferred heat convection effect along the route L via the guiding rails to improve the whole heat dissipation efficiency of the heat dissipation module 300. In addition, when the detachable expansion card 10 is not in used (for example, it is carried or packaged), the second heat dissipation unit 360 may be restored to the initial position (as shown in FIG. 1A). In this way, the heat dissipation module 300 of the detachable expansion card 10 is not damaged by the external force in carrying easily.

To sum up, in the invention, the second heat dissipation unit is capable of sliding relative to the first heat dissipation unit. Therefore, when the detachable expansion card is used, the second heat dissipation unit may slide to a position with a good heat convection effect to have preferred heat dissipation efficiency. In this way, the heat dissipation module of the invention may effectively dissipate heat for the heat generating element on the circuit board. That is, the heat dissipation module of the invention has preferred heat dissipation efficiency.

Although the present invention has been described in considerable detail with reference to certain preferred embodiments thereof, the disclosure is not for limiting the scope of the invention. Persons having ordinary skill in the art may make various modifications and changes without departing from the scope and spirit of the invention. Therefore, the scope of the appended claims should not be limited to the description of the preferred embodiments described above.

What is claimed is:

1. A heat dissipation module adapted to dissipate heat for a heat generating element on a circuit board, the heat dissipation module comprising:
a heat transferring base whose one surface contacts the heat generating element;
a base connected to the other surface of the heat transferring base, wherein a heat transferring block is disposed at the base;
a first heat dissipation unit having a first fin assembly provided at the base;
a first heat pipe embedded at the heat transferring base, wherein one end of the first heat pipe passes through the first heat dissipation unit, and the other end passes through the heat transferring block; and
a second heat dissipation unit having a second fin assembly and a second heat pipe passing through the second fin assembly and actively connected to the heat transferring block along a route, wherein the second heat dissipation unit is adapted to move relative to the first heat dissipation unit along the route.

2. The heat dissipation module according to claim 1, wherein the first heat pipe has a first pipe body embedded at the heat transferring base, a second pipe body extending from one end of the first pipe body and passing through the first heat dissipation unit and a third pipe body extending from the other end of the first pipe body and passing through the heat transferring block.

3. The heat dissipation module according to claim 1, wherein the first heat dissipation unit further comprises a first cover covering the first fin assembly, and the first heat pipe passes through the first cover and the first fin assembly.

4. The heat dissipation module according to claim 1, wherein a guiding rail is disposed at the base, a guiding element is disposed at the second heat dissipation unit, and the second heat dissipation unit is glidingly disposed at the guiding rail via the guiding element to move along the route.

5. The heat dissipation module according to claim 4, wherein the second heat dissipation unit further comprises a second cover covering the second fin assembly, and the second heat pipe passes through the second cover and the second fin assembly.

6. The heat dissipation module according to claim 5, wherein the guiding element is a connecting post disposed at one surface of the second cover, and the surface faces the base.

7. The heat dissipation module according to claim 1, wherein the heat transferring base further comprises a plurality of supporting posts connected to the base.

8. The heat dissipation module according to claim 1, wherein the heat transferring block has two through holes, the first heat pipe passes through one of the through holes, and the second heat pipe actively passes through the other one of the through holes along the route.

9. The heat dissipation module according to claim 8, further comprising two pieces of heat dissipation cream provided in the through holes, wherein the first heat pipe contacts the heat transferring block via one of the two pieces of the heat dissipation cream, and the second heat pipe contacts the heat transferring block via the other one of the two pieces of the heat dissipation cream.

10. A detachable expansion card, comprising:
a circuit board having a heat generating element; and
a heat dissipation module adapted to dissipate heat for the heat generating element, the heat dissipation module comprising:
a heat transferring base whose one surface contacts the heat generating element;
a base connected to the other surface of the heat transferring base, wherein a heat transferring block is disposed at the base;
a first heat dissipation unit having a first fin assembly provided at the base;
a first heat pipe embedded at the heat transferring base, wherein one end of the first heat pipe passes through the first heat dissipation unit, and the other end passes through the heat transferring block; and
a second heat dissipation unit having a second fin assembly and a second heat pipe passing through the second fin assembly and actively connected to the heat transferring block along a route, wherein the second heat dissipation unit is adapted to move relative to the first heat dissipation unit along the route.

11. The detachable expansion card according to claim 10, wherein the first heat pipe has a first pipe body embedded at the heat transferring base, a second pipe body extending from one end of the first pipe body and passing through the first heat dissipation unit and a third pipe body extending from the other end of the first pipe body and passing through the heat transferring block.

12. The detachable expansion card according to claim 10, wherein the first heat dissipation unit further comprises a first cover covering the first fin assembly, and the first heat pipe passes through the first cover and the first fin assembly.

13. The detachable expansion card according to claim 10, wherein a guiding rail is disposed at the base, a guiding element is disposed at the second heat dissipation unit, and the second heat dissipation unit is glidingly disposed at the guiding rail via the guiding element to move along the route.

14. The detachable expansion card according to claim 13, wherein the second heat dissipation unit further comprises a second cover covering the second fin assembly, and the second heat pipe passes through the second cover and the second fin assembly.

15. The detachable expansion card according to claim 14, wherein the guiding element is a connecting post disposed at one surface of the second cover, and the surface faces the base.

16. The detachable expansion card according to claim 10, wherein the heat transferring base further comprises a plurality of supporting posts connected to the base.

17. The detachable expansion card according to claim 10, wherein the heat transferring block has two through holes, the first heat pipe passes through one of the through holes, and the second heat pipe actively passes through the other one of the through holes along the route.

18. The detachable expansion card according to claim 17, wherein heat dissipation module further comprises two pieces of heat dissipation cream provided in the through holes, wherein the first heat pipe contacts the heat transferring block via one of the two pieces of the heat dissipation cream, and the second heat pipe contacts the heat transferring block via the other one of the two pieces of the heat dissipation cream.

* * * * *